United States Patent
Leigh et al.

(10) Patent No.: US 10,048,451 B1
(45) Date of Patent: Aug. 14, 2018

(54) OPTICAL CONNECTORS WITH POSITIONS

(71) Applicant: Hewlett Packard Enterprise Development LP, Houston, TX (US)

(72) Inventors: Kevin Leigh, Houston, TX (US); John Norton, Houston, TX (US); George D. Megason, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/430,204

(22) Filed: Feb. 10, 2017

(51) Int. Cl.
| | |
|---|---|
| *G02B 6/36* | (2006.01) |
| *G02B 6/38* | (2006.01) |
| *G02B 6/44* | (2006.01) |
| *G02B 6/42* | (2006.01) |
| *H05K 7/14* | (2006.01) |

(52) U.S. Cl.
CPC ......... *G02B 6/3897* (2013.01); *G02B 6/3825* (2013.01); *G02B 6/4292* (2013.01); *G02B 6/4452* (2013.01); *H05K 7/1491* (2013.01)

(58) Field of Classification Search
CPC .................................................. G02B 6/3897
See application file for complete search history.

(56) References Cited

U.S. PATENT DOCUMENTS

| | | | | |
|---|---|---|---|---|
| 5,528,711 A | * | 6/1996 | Iwano | G02B 6/3817 385/55 |
| 5,590,228 A | | 12/1996 | Gibola et al. | |
| 6,467,970 B1 | * | 10/2002 | Carberry | G02B 6/3897 385/56 |
| 6,467,971 B1 | * | 10/2002 | Carberry | G02B 6/3897 385/58 |
| 6,682,230 B1 | | 1/2004 | Demangone et al. | |
| 8,798,411 B1 | * | 8/2014 | Miller | G02B 6/3502 385/26 |
| 9,477,050 B2 | * | 10/2016 | Megason | G02B 6/4261 |
| 2003/0076658 A1 | * | 4/2003 | Aronson | G02B 6/4201 361/741 |
| 2009/0047800 A1 | * | 2/2009 | Tabet | H01R 13/518 439/32 |
| 2009/0232455 A1 | * | 9/2009 | Nhep | G02B 6/3825 385/59 |
| 2010/0209063 A1 | * | 8/2010 | Hoshino | G02B 6/3897 385/135 |
| 2014/0029899 A1 | | 1/2014 | Isenhour et al. | |
| 2014/0286609 A1 | | 9/2014 | Hodge et al. | |

(Continued)

FOREIGN PATENT DOCUMENTS

| | | |
|---|---|---|
| JP | 3267757 B2 | 3/2002 |
| WO | WO-2012178070 A2 | 12/2012 |

OTHER PUBLICATIONS

Extended European Search Report, EP Application No. 18155532.7, dated Jun. 7, 2018, pp. 1-9, EPO.

*Primary Examiner* — Rhonda Peace
(74) *Attorney, Agent, or Firm* — Hewlett Packard Enterprise Patent Department

(57) ABSTRACT

Examples described herein include optical connectors with different positions. In some examples, an electronic device comprises a housing, an optical fiber, and a first optical connector secured to the optical fiber. The housing may have a first wall. The optical fiber may be within the housing. The first optical connector may be moveable between a first position and a second position along the first wall.

15 Claims, 13 Drawing Sheets

(56) References Cited

U.S. PATENT DOCUMENTS

| | | | |
|---|---|---|---|
| 2014/0334783 A1* | 11/2014 | Megason | G02B 6/3897 385/89 |
| 2014/0369654 A1* | 12/2014 | Magason | G02B 6/4261 385/92 |
| 2015/0029495 A1* | 1/2015 | Leigh | B08B 5/02 356/73.1 |
| 2015/0098683 A1* | 4/2015 | Gross | G02B 6/4455 385/135 |
| 2016/0103285 A1* | 4/2016 | Megason | G02B 6/4261 385/135 |

* cited by examiner

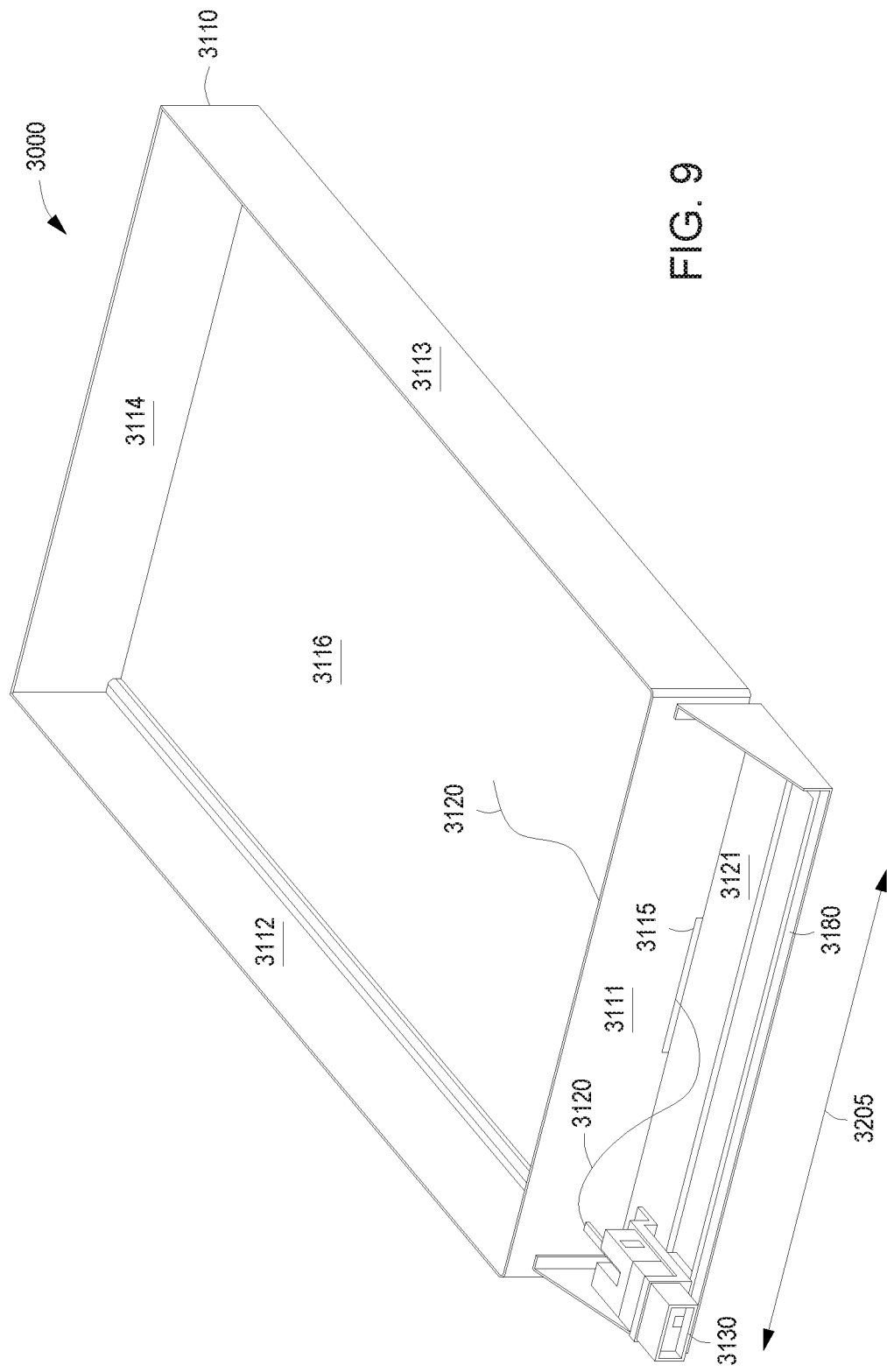

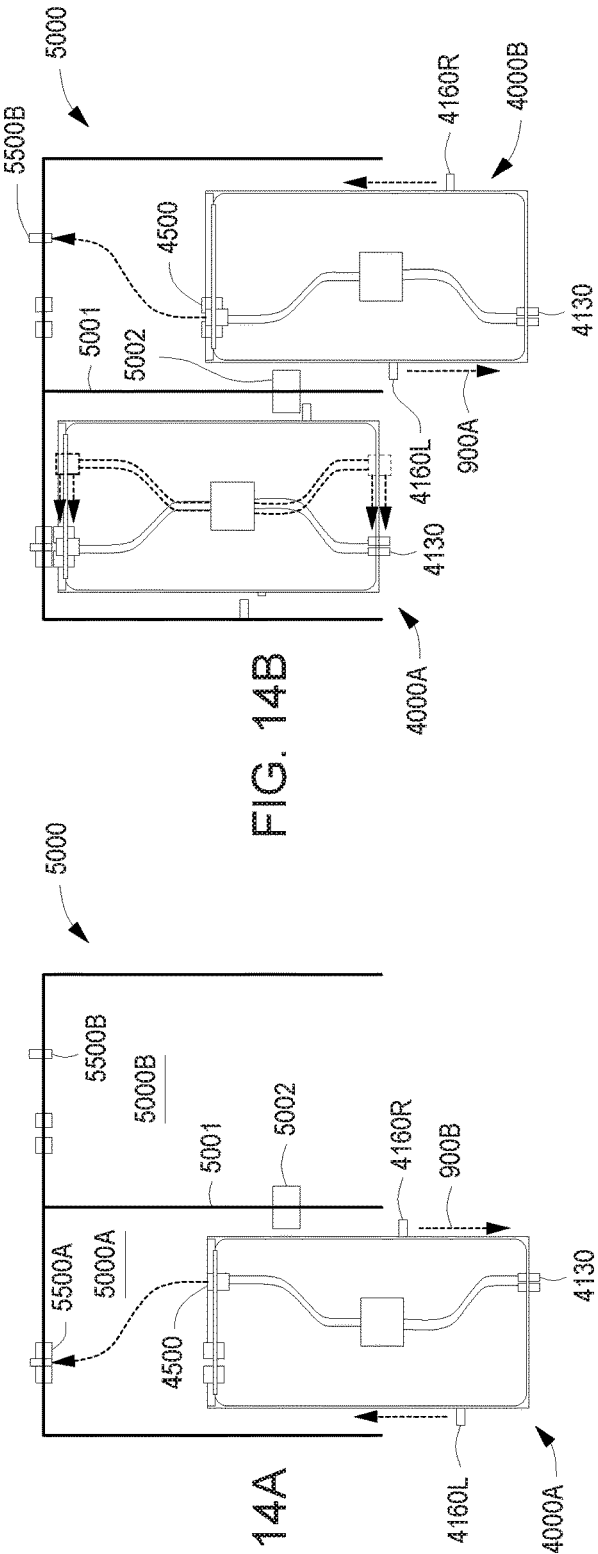
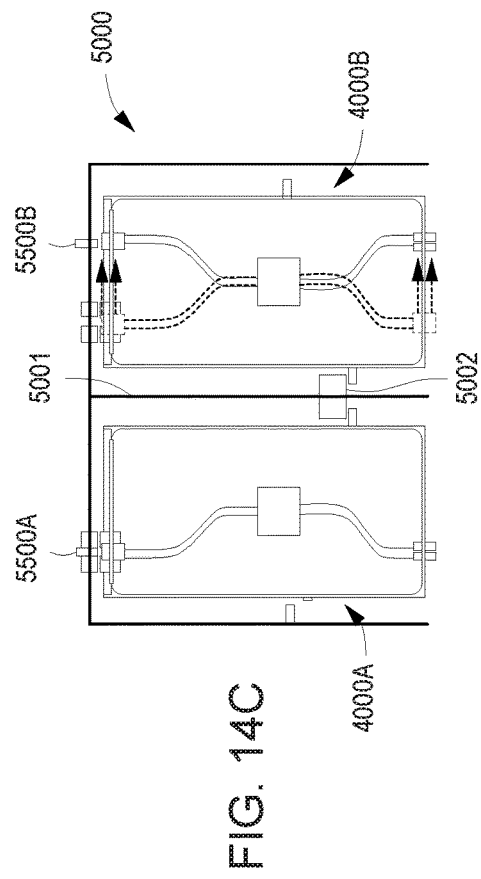

OPTICAL CONNECTORS WITH POSITIONS

BACKGROUND

Data centers may include enclosures to hold multiple servers in a vertical space. These enclosures may be referred to as rack systems. In some examples, one rack may include multiple shelves stacked upon each other and one shelf may hold multiple servers in a horizontal orientation. A rack may have also have a cable management system that allows the connection of individual servers to systems and networks outside of the rack. The cable management system may include connectors such as optical connectors.

BRIEF DESCRIPTION OF THE DRAWINGS

The following detailed description references the drawings, wherein:

FIG. 9 illustrates a front, right perspective view of an electronic device, according to some examples.

FIG. 14A illustrates the movement of the optical connector of the electronic device of FIG. 11, according to some examples.

FIG. 14B illustrates the movement of the optical connector of the electronic device of FIG. 11, according to some examples.

FIG. 14C illustrates the movement of the optical connector of the electronic device of FIG. 11, according to some examples.

DETAILED DESCRIPTION

The connectors of a cable management structure of an enclosure (e.g., rack, etc.) allow the electronic device (e.g., server, etc.) housed inside the enclosure to communicate with other devices used in the data center. Thus, for an electronic device that is housed in the enclosure to be operable inside the enclosure, the connectors of the electronic device should align with the connectors of the cable management structure.

However, in some examples, cable management structures in an enclosure have specific orientations. For example, a rack may have a backplane with certain connectors located on a specific side of the rack. These specific orientations may not be compatible with a type of electronic device. For example, a cable management structure may have optical connectors on the left side of the rack while an electronic device may have optical connectors on the right side. Accordingly, electronic devices with static optical connectors are not flexible and not adaptable to multiple cable management structures.

Examples described herein address these technical challenges by providing a way for the connectors (e.g., optical connector) on an electronic device to be repositioned based on the cable management system of the enclosure in which it is inserted. An electronic device may have an optical connector that is moveable between a number of operable positions on a wall of the electronic device. In some examples, the optical connector may be repositioned without accessing the interior of the electronic device. Additionally, in some examples, the optical connector may be automatically repositioned to the compatible position upon insertion of the electronic device into the enclosure. Accordingly, examples disclosed herein provide a way for an electronic device to automatically and dynamically be repositioned, making the electronic device adaptable to multiple enclosure environments. Additionally, this may allow for one SKU to be used for multiple configurations.

Figure 1A:
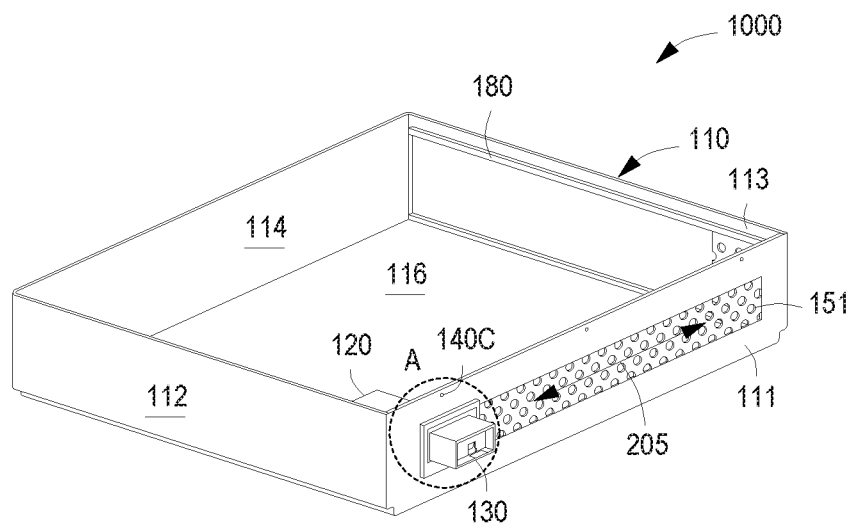
FIG. 1A illustrates a front, left perspective view of an electronic device with an optical connector, according to some examples.
Figure 1B:
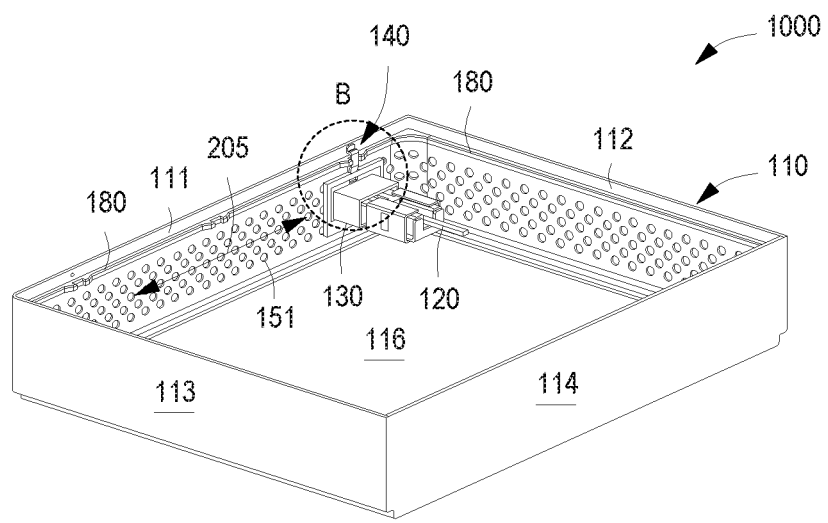
FIG. 1B illustrates a back, right perspective view of the electronic device of FIG. 1A, according to some examples.

Referring now to the figures, FIGS. 1A and 1B illustrate an electronic device with a moveable optical connector. FIG. 1A illustrates a front, left perspective view of an electronic device 1000. FIG. 1B illustrates a back, right perspective view of electronic device 1000. Electronic device, as used herein, may include any device with an electrical component. Non-limiting examples of an electronic device include a server, a networking device (e.g., switch, patch panel, etc.), workstation, a storage device, a memory device, a media converter (e.g., optical transceiver, etc.) or any other device with an electrical component. In some examples, electronic device 1000 may be a server that is installed in a rack and connects to a rack-level cable management system such as a backplane.

Electronic device 1000 comprises a housing 110, an optical fiber 120, and an optical connector 130. Housing 110 may enclose the electrical components of electronic device 1000 (not shown) and may include a first wall 111, a second wall 112, a third wall 113, a fourth wall 114, a floor 116, and a ceiling. The ceiling may form an enclosure with first wall, second wall, third wall, fourth wall, and floor to house the electrical components of electronic device 1000. The ceiling is not shown in FIGS. 1A and 1B. In examples where electronic device 1000 is a server, first wall 111 may make up the server faceplate. Optical fiber 120 may be located inside housing 110. In some examples, and as shown in FIGS. 1A and 1B, optical fiber 120 is contained within housing 110 and does not extend outside of housing 110. Optical fiber 120 may also be secured to optical connector 130. As used herein, secured is a direct connection between two parts such that the direct connection does not easily give way or become loose and the two parts that are secured together do not easily come apart without physical manipulation of the direct connection. Thus, optical connector 130 may be used to connect to a mating optical connector of an enclosure that electronic device 1000 is housed within. Accordingly, the signal from optical fiber 120 is transmitted to the mating optical connector via optical connector 130. Optical connector 130 is moveable between a first position and a second position along first wall 111. This movement is represented by arrow 205.

In some examples, and as shown in FIGS. 1A and 1B, optical connector 130 protrudes through first wall 111 of housing 110 such that one end of optical connector 130 (i.e. the end that connects to mating optical connector) extends beyond housing 110 to the outside of housing 110 and one end of optical connector 130 (i.e. the end that is secured to optical fiber 120) extends inside housing 110. In some examples, electronic device 1000 comprises a metal plate 151. Metal plate 151 may extend along first wall 111, second wall 112, and third wall 113. In some examples, metal plate 151 extends along the entire length of first wall 111 but does not extend along the entire lengths of second wall 112 and/or third wall 113. This, as will be described herein, allows movement of metal plate 151 along the first wall 111, the second wall 112, and the third wall 113.

Electronic device 1000 may also comprise a retention track 180. Retention track 180, like metal plate 151, may extend along first wall 111, second wall 112, and third wall 113. In some examples, retention track 180 may be secured to first wall 111, second wall 112, and third wall 113. Retention track 180 may include two rails which protrude into the interior of housing 110. The distance between the two rails may be equal to the width of metal plate 151. Accordingly, the rails of retention track 180 may retain metal plate 151 such that metal plate 151 is in close proximity to first wall 111, second wall 112, and third wall 113 but at the same time allow metal plate 151 to slide along first wall 111, second wall 112, and third wall 113. In some examples, and as shown in FIGS. 1A and 1B, retention track 180 may extend along the entire lengths of first wall 111, second wall 112, and third wall 113, allowing for a longer track along which metal plate 151 may slide. In other examples, retention track 180 extends along the entire length of first wall 111 and a portion of second wall 112 and a portion of third wall 113. A longer retention track 180 along length of second wall 112 and third wall 113 may allow for a greater range of movement for metal plate 151.

Metal plate 151 may be comprised of electrically conductive, flexible material. A non-limiting material is stainless steel. The metal material may serve as a shield of electromagnetic interference (EMI) for electronic device 1000. The flexibility of metal plate 151 allows it to straighten while on first wall 111 and to bend while transitioning from first wall 111 to second wall 112 or from first wall 111 to third wall 113. In some examples, and as shown in FIGS. 1A and 1B, metal plate 151 may have perforations allowing for air flow through metal plate 151 to provide a pathway for heat to escape outside of housing 110 or a pathway for cool air to be pulled into housing 110. These perforations may help to regulate the heat created by electronic device 1000. Accordingly, first wall 111 may have a window that extends along its length, exposing metal plate 151 to the outside environment and allowing for air to flow through the perforations.

Optical connector 130 may be secured to metal plate 151. For example, metal plate 151 may have an opening that allows for the insertion of optical connector 130 through metal plate 151. Accordingly, movement 205 of optical connector 130 along first wall 111 in one direction also moves metal plate 151 in the same direction. Movement of metal plate 151 allows optical connector 130 of electronic device 1000 to be moved to a different position from the outside of housing 110. For example, electronic device 1000 may be a closed environment in which the electrical components of electronic device 1000 are not accessible without removing one of the walls, the floor, or the ceiling. Metal plate 151 and its securement to optical connector 130 allows optical connector 130 to be moved to a different position from the outside of electronic device 1000 without accessing the interior of housing 110. Additionally, optical connector 130 protrudes from housing 110 during its movement from one position to another position.

Figure 2A:
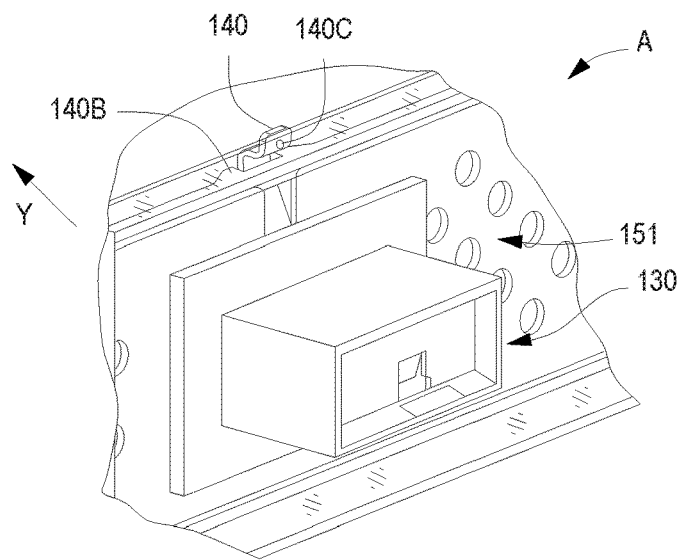
FIG. 2A illustrates a close up view of area A in FIG. 1A, according to some examples.
Figure 2B:
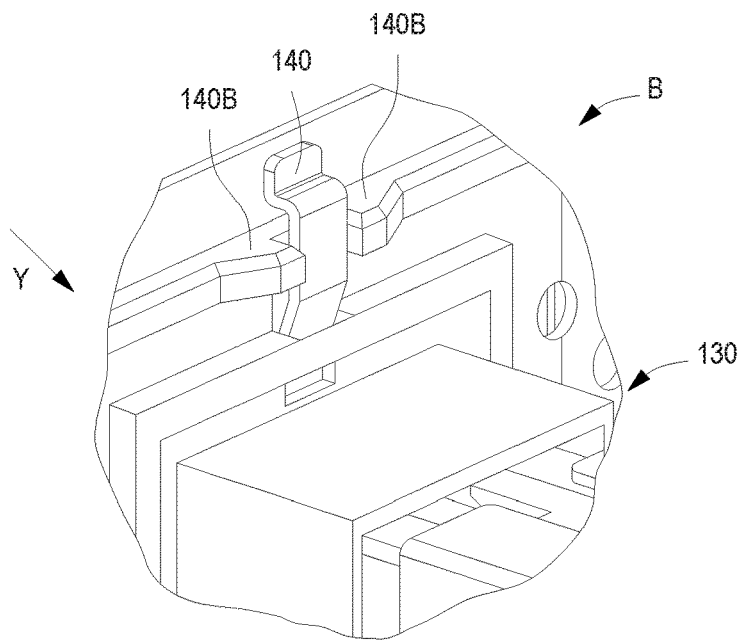
FIG. 2B illustrates a close up view of area B in FIG. 1B, according to some examples.

FIGS. 2A and 2B illustrate exploded views of the interaction of the optical connector 130 with the first wall 111. FIG. 2A shows an exploded view of area A in FIG. 1A. FIG. 2B shows an exploded view of area B in FIG. 1B. In FIG. 2A, first wall 111 is shown as see-through for clarity. In some examples, electronic device 1000 may include a fastener 140. Fastener 140 may hold optical connector 130 in place when the optical connector 130 is in a first position. In some examples, fastener 140 may take the form of a latch. Latch 140 is secured to optical connector 130 and is moveable in the Y direction. Electronic device 1000 may include a holder 140B and a fastener opening 140C. In some examples, and as shown in FIG. 2B, holder 140B has two sloped arms, allowing for a space between the two sloped arms. The space between the two sloped arms is wide enough to hold latch 140. Latch 140 may be biased against the Y direction such that it sits lower than the height of the two sloped arms of holder 140B. Accordingly, the interaction between latch 140 and holder 140B holds optical connector 130 in a first position as holder 140B prevents latch 140 from moving. Fastener opening 140C may be a hole in first wall 111 that is positioned over latch 140. To move optical connector 130, a pin (e.g., a safety pin, etc.) may be placed within the hole to engage the latch 140, pushing latch 140B against its bias and in the Y direction. The push of the latch 140 in the Y direction allows latch 140 to disengage from holder 140B and optical connector 130 may then be moved from the first position. Electronic device 1000 may have a number of holders 140B and fastener openings 140C at different locations along first wall 111 to interact with latch 140 and hold optical connector 130 at these different locations. While a pin is described as the tool to disengage latch 140 from holder 140B, other mechanical tools may also be used. For example, fastener opening may be covered with a pushable button. When the button is pushed, an arm attached to the button that sits in the fastener opening may push latch 140 in the Y direction to disengage it from holder 140B.

Figure 3A:
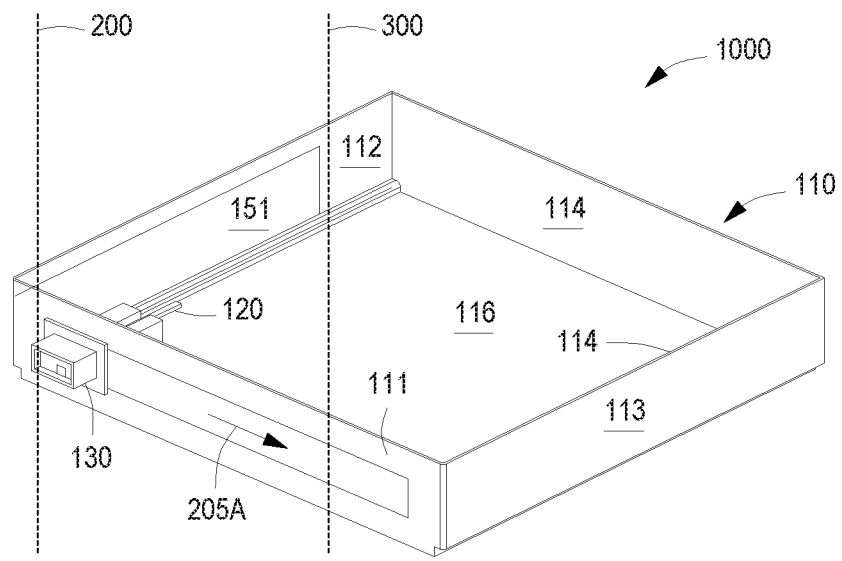
FIG. 3A illustrates the movement of the optical connector shown in FIGS. 1A and 1B, as seen from the front, according to some examples.
Figure 3B:
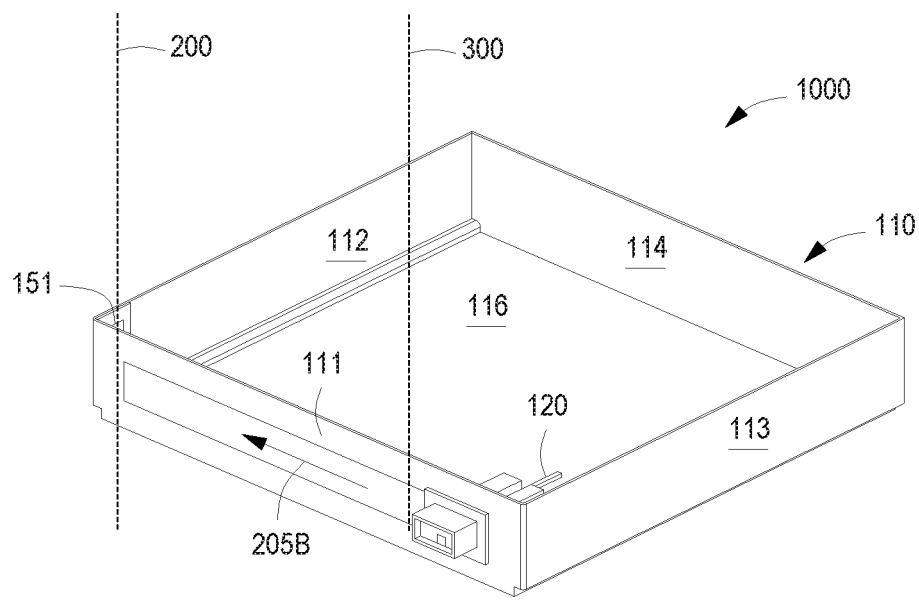
FIG. 3B illustrates the movement of the optical connector shown in FIGS. 1A and 1B, as seen from the front, according to some examples.

FIGS. 3A and 3B illustrate front views of the movement of optical connector 130 between a first position and a second position along first wall 111. In FIG. 3A, optical connector 130 is in a first position, indicated by dotted line 200. In some examples, electronic device 1000 may be a server that is used in a rack with a cable management system that has mating optical connectors near a second position, indicated by dotted line 300. Accordingly, optical connector 130 may be moved to accommodate for this.

Optical connector 130 is initially held in first position 200 by the interaction with latch 140 with holder 140B at first position 200. To move optical connector 130 from first position 200, latch 140 is disengaged from holder 140B by inserting a pin into fastener opening 140C. Latch 140 is pushed against its bias such that it may slide out of the two sloped arms of holder 140C. After latch 140 disengages from holder 140B, optical connector 130 may be moved in direction 205A. Because optical connector 130 is secured to metal plate 151, moving optical connector 130 in direction of 205A also moves metal plate 151 in the direction of 205A. When optical connector 130 is in position 200 shown in FIG. 3A, metal plate 151 extends along the entire length of first wall 111 and extends for a majority of the length of second wall 112. When optical connector 130 is moved in the direction of 205A, metal plate 151 moves in the same direction such that metal plate 151 extends for a shorter length along second wall 112 and extends for a longer length along third wall 113 as compared to the position shown in FIG. 3A. Upon arriving at position 300, latch 140 may engage with holder 140B located at second position 300 due to its bias. Accordingly, latch 140 may hold optical connector 130 at a second location 300. Thus, the movability and adjustability of the optical connector 130 of electronic device 1000 makes electronic device 1000 adaptable to the specific environment in which it is used and makes electronic device 1000 versatile. Optical connector 130 may also be moved in direction 205B to go back to first position 200 by disengaging latch 140 from holder 140B located at second position 300.

Figure 4A:
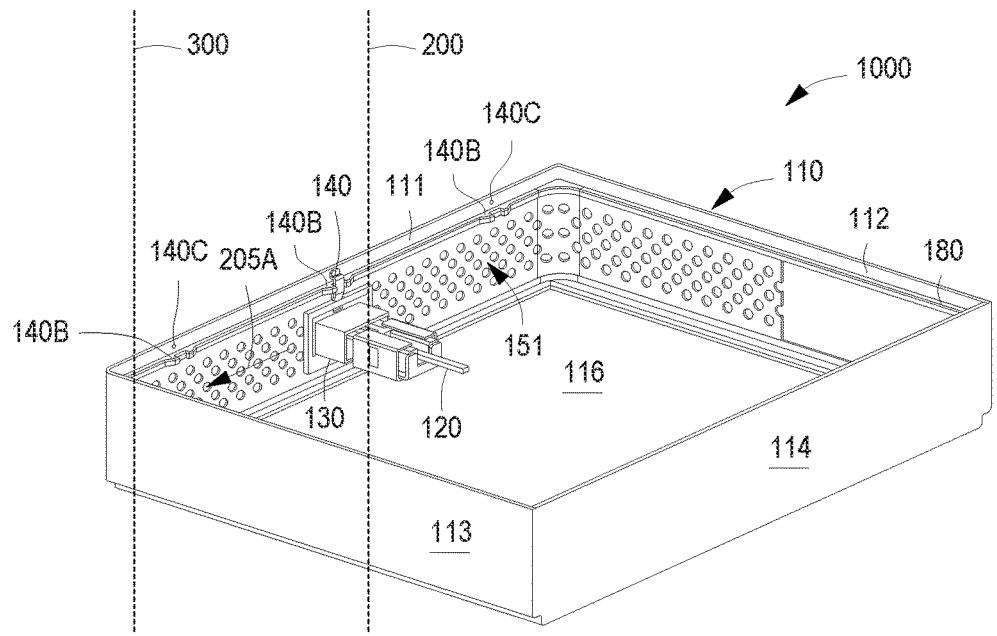
FIG. 4A illustrates the movement of the optical connector shown in FIGS. 1A and 1B, as seen from the back, according to some examples.
Figure 4B:
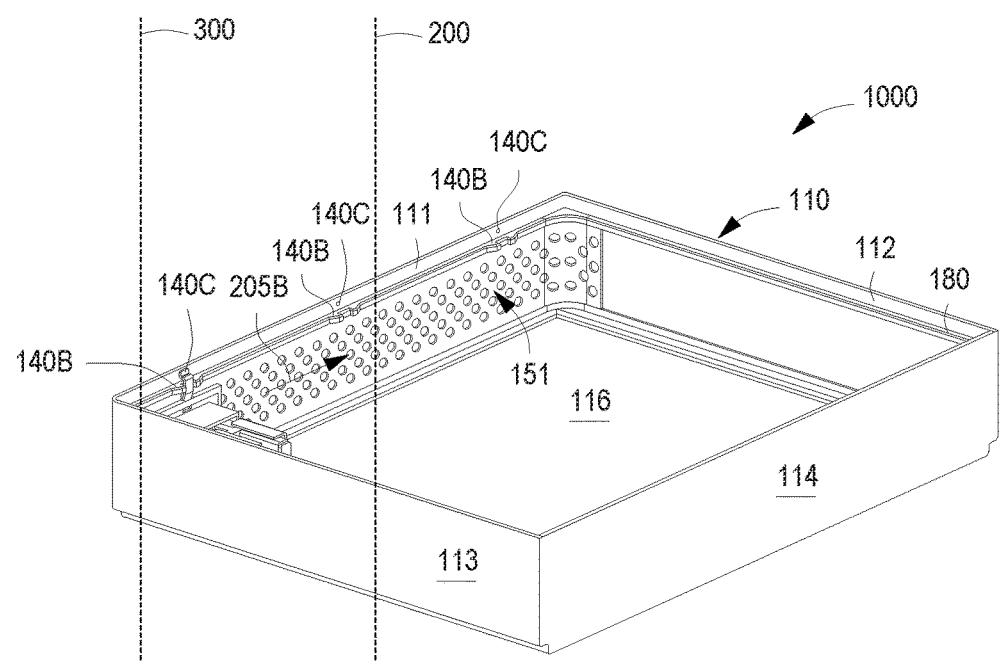
FIG. 4B illustrates the movement of the optical connector shown in FIGS. 1A and 1B, as seen from the back, according to some examples.

FIGS. 4A and 4B illustrate back views of the movement of optical connector 130 between a first position 200 and a second position 300 along first wall 111. Fourth wall 114 is shown as being see through in FIGS. 4A and 4B for clarity of other features of electronic device 1000. The use of "first position" in relation to a specific figure or set of related figures may or not may not correspond to the same physical position on the first wall in relation to another figure or set of related figures. For example, first position 200 in FIGS. 3A and 3B may be different from first position 200 in FIGS. 4A and 4B. Similarly, the use of "second position" in relation to a specific figure or set of related figures may or may not correspond to the same physical position on the first wall in relation to another figure or set of related figures. However, in relation to each figure or set of related figures, the second position is characterized as a "second" position to differentiate it from the "first" position.

In FIGS. 4A and 4B, optical connector 130 of electronic device 1000 may be in a first position 200. However, optical connector 130 may need to be moved so that it may interact with a mating optical connector that is located at second position 300. For example, electronic device 1000 may be a half-width server that is inserted into a rack system. The rack system may have cable management system that has mating optical connectors at position 300. Accordingly, optical connector 130 of electronic device 1000 needs to be moved to be able to connect to the mating optical connector of the rack.

Optical connector 130 is initially held in first position 200 by the interaction of latch 140 with holder 140B at first position 200. To move optical connector 130 from first position 200 to second position 300, latch 140 is disengaged from holder 140B by inserting a pin into fastener opening 140C. Latch 140 is pushed against its bias such that it may slide out of the two sloped arms of holder 140C. After latch 140 disengages from holder 140B, optical connector 130 may be moved in direction 205A. Because optical connector 130 is secured to metal plate 151, moving optical connector 130 in direction of 205A also moves metal plate 151 in the direction of 205A. When optical connector 130 is in position 200 shown in FIG. 4A, metal plate 151 extends along the entire length of first wall 111 and extends for a portion of the length of second wall 112. When optical connector 130 is moved in the direction of 205A, metal plate 151 moves in the same direction such that metal plate 151 extends for a shorter length along second wall 112 and extends for a longer length along third wall 113 as compared to the position shown in FIG. 4A. Upon arriving at position 300, latch 140 may engage with holder 140B located at second position 300 due to its bias. Accordingly, latch 140 may hold optical connector 130 at a second location 300. Optical connector 130 may also be moved in direction 205B to go back to first position 200 by disengaging latch 140 from holder 140B located at second position 300.

While a first position and a second position have been described in relation to FIGS. 1A-FIG. 4B, electronic device 1000 may have a number of positions at which optical connector 130 may be moved to such that it is operable (i.e., in a position in which it is able to connect to a mating optical connector and held in the position). For example, there may be three positions, four positions, etc. along first wall 111 that optical connector 130 may be moved to and held in place.

Figure 5A:
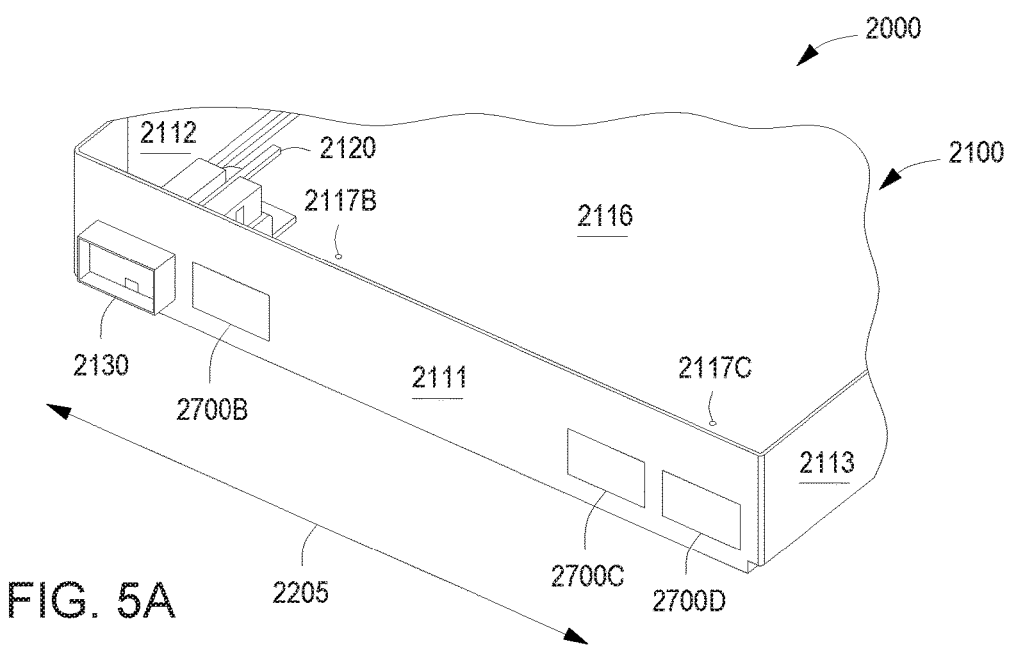
FIG. 5A illustrates a front, left perspective view of an electronic device, according to some examples.
Figure 5B:
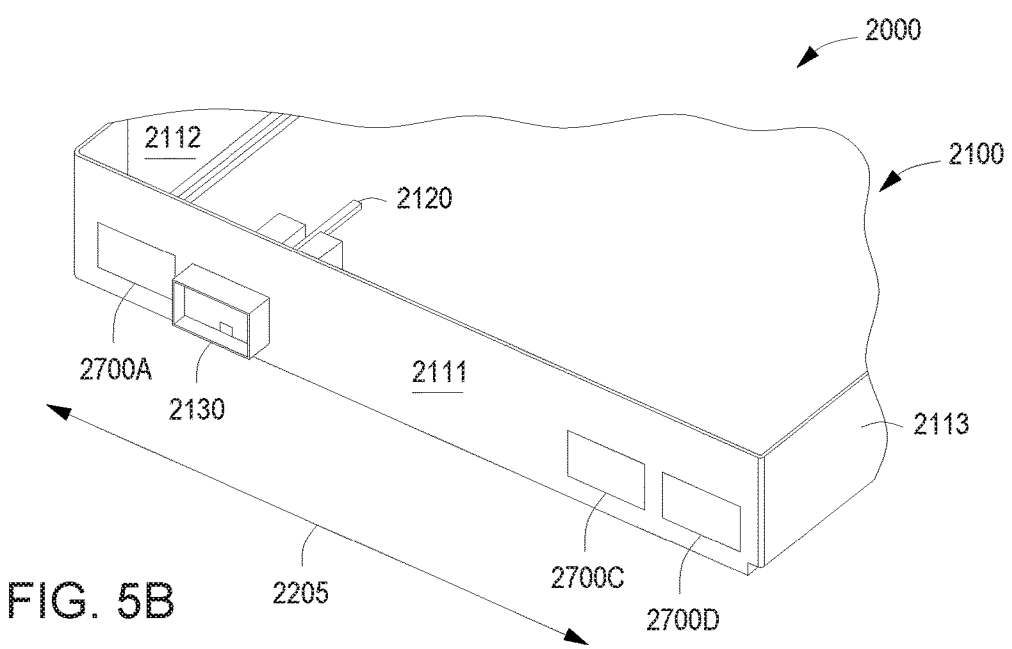
FIG. 5B illustrates the electronic device of FIG. 5A, with the optical connector in a different position, according to some examples.

FIGS. 5A and 5B illustrate partial front views of an electronic device 2000 with a moveable optical connector 2130. Electronic device 2000, similar to electronic device 1000, comprises a housing 2110. Housing 2110 has a first wall 2111, a second wall 2112, a third wall 2113, a fourth wall (not shown), a ceiling (not shown) and a floor 2116. Electronic device 2000 has an optical fiber 2120 that is housed within housing 2110. Electronic device 2000 also has an optical connector 2130 secured to optical fiber 2120. Optical connector 2130, similar to optical connector 130, has a number of operable positions along first wall 2111. For example, FIG. 5A illustrates optical connector 2130 at a first operable position. In FIG. 5B, optical connector 2130 has been moved through movement 2205 to a second operable position. Housing 2110, and specifically, first wall 2111, has a corresponding number of openings for optical connector 2130 that is equal to the number of operable positions. These openings allow optical connector 2130 to protrude from housing 2110. When an opening corresponding to a certain position is not being used (i.e., the optical connector 2130 is a different operable position), covers 2700A, 2700B, 2700C, and 2700D may be used to close the openings. Housing 2110 may also have a corresponding number of holes 2117A, 2117B, 2117C, 2117D on floor 2116 of housing 2110 that may be used to hold optical connector 2130 in the operable positions, as will be described in more detail herein.

Figure 6:
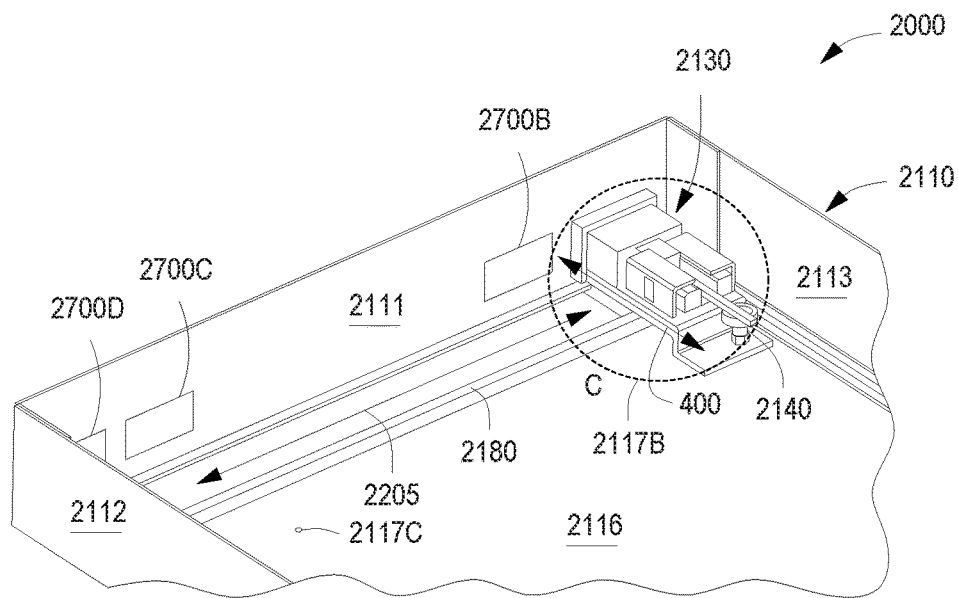
FIG. 6 illustrates the interior of the electronic device of FIG. 5A, according to some examples.

FIG. 6 illustrates a partial back view of electronic device 2000. As shown in FIG. 6, electronic device 2000 comprises a retention track 2180 that extends along first wall 2111. Optical connector 2130 may slide in retention track 2180 to move to the different operable positions. This movement is represented by arrow 2205. Optical connector 2130 may also include a fastener 2140 to hold optical connector 2130 in the different operable positions. Fastener 2140 may be a pin, a spring plunger, etc. that is inserted into holes 2117A-2117D to hold optical connector 2130 in the different operable positions.

Figure 7:
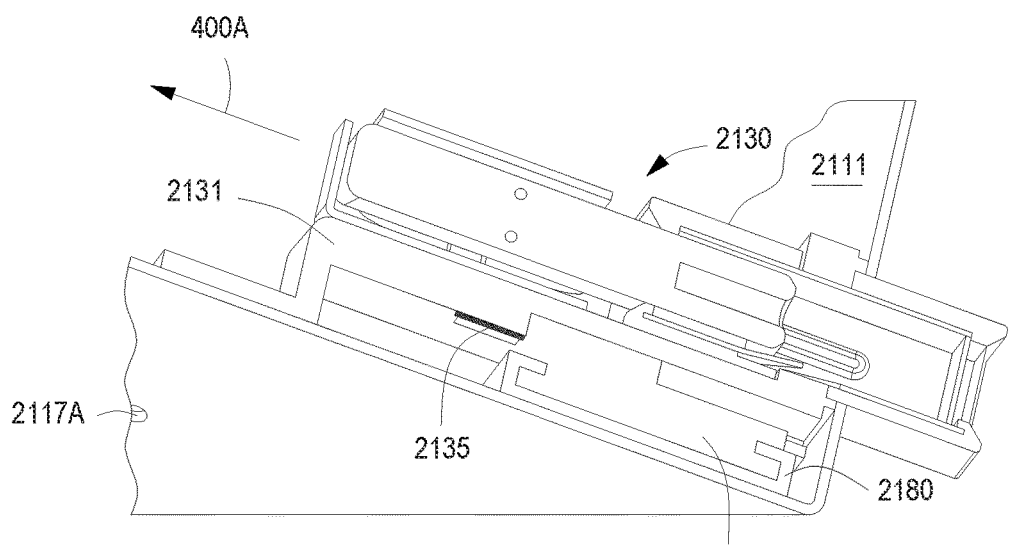
FIG. 7 illustrates a close up view of area C in FIG. 6, according to some examples.

In some examples, optical connector 2130 is spring loaded and thus retractable from the outside of housing 2110. FIG. 7 illustrates a cross-sectional view of area C of FIG. 6. Optical connector 2130 may comprise a carrier 2131, a base 2132, and a spring 2135 that is connected on one end to the base 2132 and on the other end to the carrier 2131. The base 2132 is secured to retention track 2180 and may be complementary in shape to retention track 2180. This complementary shape allows optical connector 2130 to slide in retention track 2180 but unable to be removed from retention track 2180.

Carrier 2131 is secured to base 2132 such that carrier 2131 may move in relation to base 2132 but is otherwise unable to be removed from base 2132. This movement is represented by arrow 400 in FIG. 6 and is due to the fact that carrier 2131 is spring loaded on base 2132 via spring 2135. Carrier 2131 is biased on base 2132 such that optical connector 2130 protrudes outside housing 2110. In other words, when optical connector 2130 protrudes outside of housing 2110, spring 2135 is in an unextended or rest position. When optical connector 2130 is pulled in direction 400A, as shown in FIG. 7, optical connector 2130 no longer protrudes from the outside of housing 2110 and spring 2135 is extended, as will be shown in FIG. 8B. When force from optical connector 2130 is released, the spring 2135 moves back to its unextended position, biasing carrier 2131 back into a position where optical connector 2130 protrudes outside of housing 2110. Carrier 2131 is stationary secured to the remainder of optical connector 2130 such that a movement of carrier 2131 results in the equal movement of the remainder of optical connector 2130.

Figure 8A:
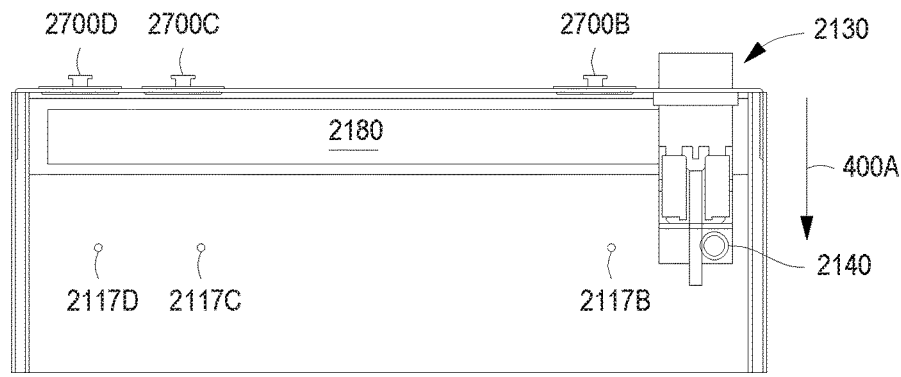
FIG. 8A illustrates the movement of the optical connector in the electronic device of FIG. 5A, according to some examples.
Figure 8B:
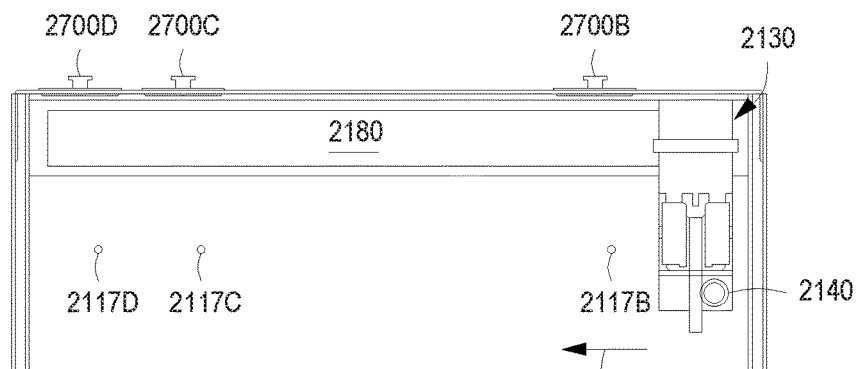
FIG. 8B illustrates the movement of the optical connector in the electronic device of FIG. 5A, according to some examples.

FIGS. 8A-8D illustrate the movement of optical connector 2130 from a first position to a second position along first wall 2111. In FIG. 8A, optical connector 2130 is in a first position. To move optical connector 2130 to a second position, pin 2140 may be loosened so that it no longer interacts with hole 2117A. Carrier 2131 may then be moved in direction 400A in relation to base 2132. This movement extends spring 2135 (not visible in FIGS. 8A-8D) and retracts optical connector 2130 against its bias so that it no longer protrudes beyond housing 2110. This is shown in FIG. 8B. Optical connector 2130 may be moved in direction 205A to a second position. This is accomplished through base 2132 sliding in retention track 2180, carrying optical connector 2130 along with it. Accordingly, optical connector 2130 is retracted inside housing 2110 during its movement from one operable position to another operable position.

Figure 8C:
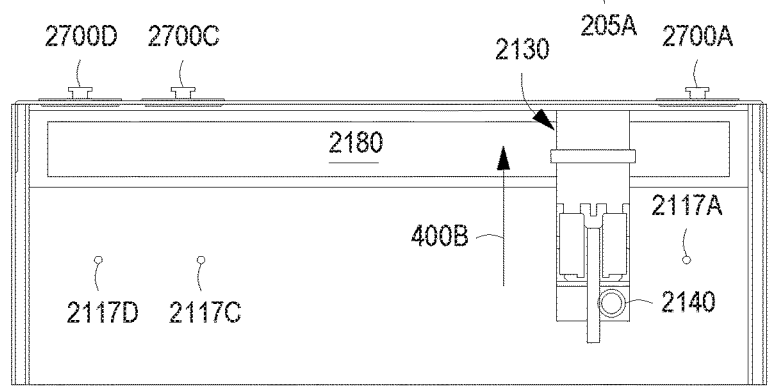
FIG. 8C illustrates the movement of the optical connector in the electronic device of FIG. 5A, according to some examples.
Figure 8D:
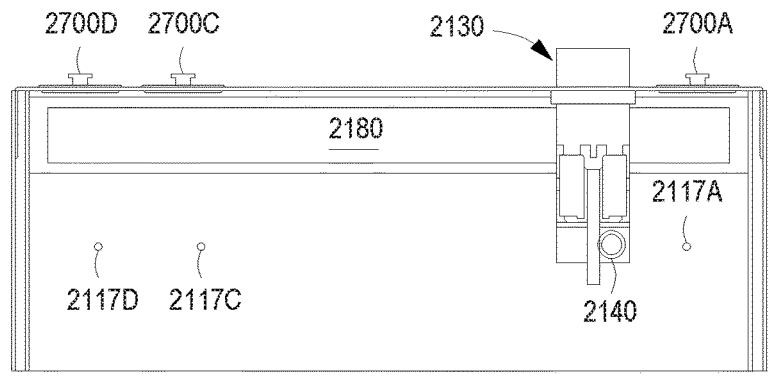
FIG. 8D illustrates the movement of the optical connector in the electronic device of FIG. 5A, according to some examples.

Once at a second position, the cover 2700B closing the opening in first wall 2111 may be removed. The force on optical connector 2130 may also be removed. At the removal of the force, spring 2135 moves from its extended position back to a rest position, thus biasing carrier 2131 in direction 400B, as shown in FIG. 8C. Accordingly, optical connector 2130 once more protrudes into the outside environment of housing 2110, as shown in FIG. 8D. Fastener 2140 may be tightened so that it interacts with hole 2117B to hold optical connector 2130 at the second position. While FIGS. 5A, 5B, 6, 7, and 8A-8D show optical connector 2130 as having four operable positions, electronic device 2000 is not limited to having the number of operable positions shown. For example, optical connector 2130 may have two, three, five, six, etc., operable positions. As compared to electronic device 1000, optical connector 2130 of electronic device 2000 is manipulated from the inside of housing 2110 and not from the outside of housing 2110.

FIG. 9 illustrates a front, right view of an electronic device 3000 with a moveable optical connector 3130. Electronic device 3000, similar to electronic device 1000 and 2000, comprises a housing 3100. Housing 3100 has a first wall 3111, a second wall 3112, a third wall 3113, a fourth wall 3114, a floor 3116, and a ceiling 3118. Ceiling 3118 is not shown in FIG. 9. Electronic device 3000 has an optical fiber 3120. In some examples, a portion of optical fiber 3120 is housed within housing 3110 and a portion of optical fiber 3120 extends outside of housing 3110. Housing 3110 may have an elongated slot 3115 through which optical fiber 3120 extends from the inside of the outside of housing 3110. Electronic device 3000 has an optical connector 3130 that is located outside of housing 3110. In some examples, and as shown in FIG. 9, the entirety of optical connector 3130 is located outside of housing 3110. Optical fiber 3120 is secured to optical connector 3130. Accordingly, optical fiber 3120 extends from inside of housing 3110, through slot 3115, and to the outside of housing 3110. Electronic device 3000 comprises a surface 3121 that protrudes from first wall 3111. In some examples, the surface is perpendicular to first wall 3111. Retention track 3180 extends along first wall 3111 on surface 3121. Optical connector 3130 is moveable along retention track 3180 to a number of operable positions. This movement is represented by arrow 3205. Elongated slot 3115 may be shaped and sized to allow optical fiber 3120 to move within slot 3115 to accommodate for the movement of optical connector 3130.

Figure 10:
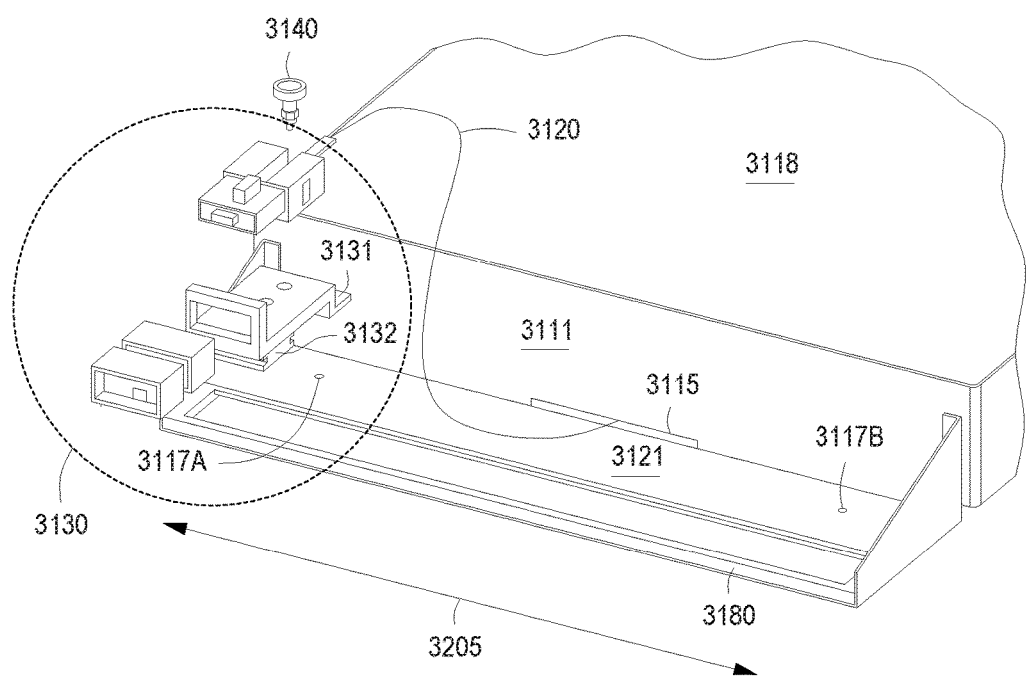
FIG. 10 illustrates a close up view of the front of the electronic device of FIG. 9, according to some examples.

FIG. 10 illustrates a close up view of electronic device 3000. Ceiling 3118 is shown in FIG. 10. Accordingly, the portion of optical fiber 3120 that is located inside of housing 3110 is not visible. As shown in FIG. 10, optical connector 3130 may comprise a base 3132, a carrier 3131, and a fastener 3140. Base 3132 is secured to retention track 3180 similar to the manner in which base 2132 is secured to retention track 2180 as described in relation to FIGS. 5A-8D. Carrier 3131 is secured to base 3132. As compared to carrier 2131 of electronic device 2000, carrier 3131 is not spring biased on base 3132. Accordingly, carrier 3131 and similarly optical connector 3130 is not retractable in relation to base 3132.

Fastener 3140 may hold optical connector 3130 in the number of positions. As shown in FIG. 10, surface 3121 of electronic device 3000 may have holes 3117A and 3117B. Fastener 3140 may be inserted into these holes to hold optical connector 3130 in the different positions. Some non-limiting examples of fastener 3140 may be a pin, a spring plunger, etc. Thus, optical connector 3130 may be moved from the position that corresponds to hole 3117A (as shown in FIG. 10) to the position that corresponds to hole 3117B by loosening fastener 3140 from hole 3117A, and sliding optical connector 3130 in retention track 3180 to a position where fastener 3140 may be inserted into hole 3117B. While FIG. 10 shows optical connector 3130 as two operable positions (with two holes 3117A and 3317B), electronic device 3000 is not limited to having the number of operable positions shown. For example, electronic device 3000 may have may have three, four, five, etc. operable positions that correspond to three, four, five, etc. holes in surface 3121. In other examples, instead of holes 3117A and 3117B provided on surface 3121, electronic device 3000 may have a second track to interact with fastener 3140. The second track may extend for the same length as retention track 3180. Fastener 3140 may be tightened to engage with the second track to hold optical connector 3130. In examples with the second track, optical connector 3130 may be positioned and operable anywhere along the retention track 3180.

Figure 11:
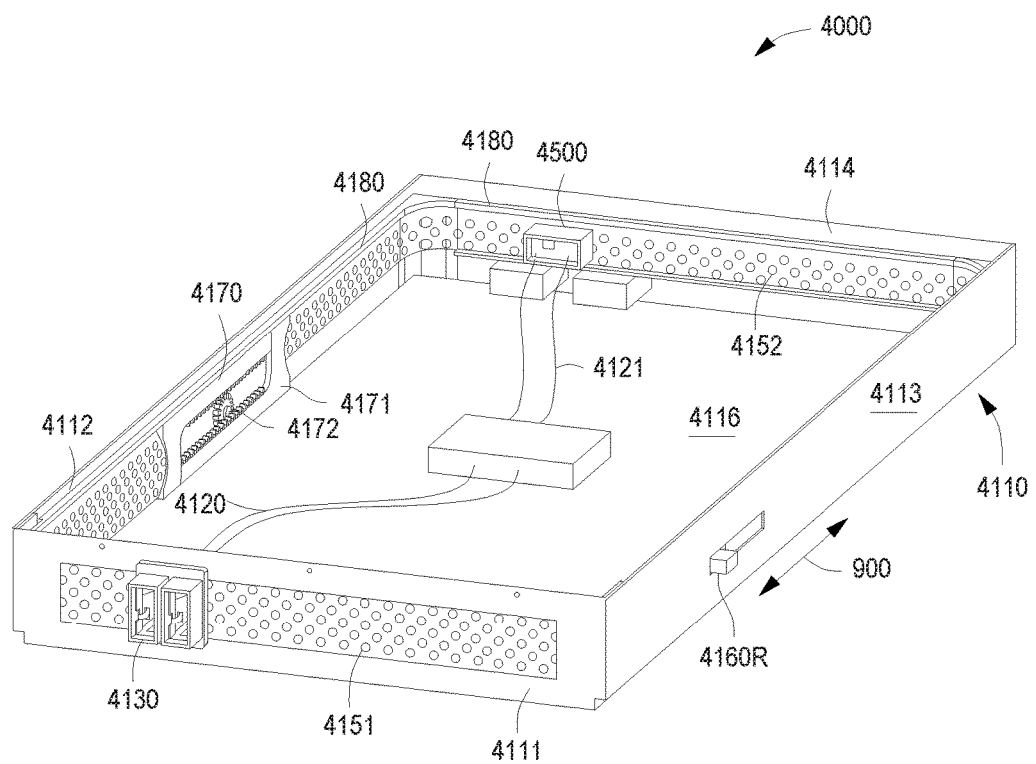
FIG. 11 illustrates a front, right perspective view of an electronic device, according to some examples.

FIG. 11 illustrates a front view of electronic device 4000 with a first optical connector 4130 and a second optical connector 4500. As will be described below, movement of first optical connector 4130 and/or second optical connector 4500 into different operable positions may be automated with the insertion of electronic device 4000 into a rack system. For example, in some situations, electronic device 4000 may be a half-width server that is for insertion into an enclosure bay in a rack system. This is described, for example, in relation to FIGS. 14A-14C. Upon insertion of the server, the enclosure bay may interact with portions of the server to automatically move the optical connectors of the server into positions that are compatible with the mating connectors of the rack.

Electronic device 4000 comprises housing 4110. Housing 4110 has a first wall 4111, a second wall 4112, a third wall 4113, a fourth wall 4114, a floor 4116, and a ceiling (not shown). As discussed above, electronic device 4000 may have a first connector 4130 and a second connector 4500. First optical connector 4130 may located on first wall 4111 and secured to a first optical fiber 4120. Second optical connector 4500 may be located on fourth wall 4114 and may be secured to a second optical fiber 4121. In some examples, first wall 4111 is a front faceplate of electronic device 4000 and fourth wall 4114 is a backplate of electronic device 4000. Thus, electronic device 4000 may optically connect to two different systems. For example, electronic device 4000 may connect to a system in the front via first optical connector 4130 and to the rack cable management system via second optical connector 4500. First optical fiber 4120 and second optical fiber 4121 may or may not be optically connected to each other.

In some examples, electronic device 4000 comprises a first metal plate 4151. First metal plate 4151, like metal plate 151 as described in relation to FIGS. 1A-4B, may extend along first wall 4111, second wall 4112, and third wall 4113. First optical connector 4130 may be secured to first metal plate 4151, similar to the interaction of optical connector 130 and metal plate 151 as described in relation to FIGS. 1A-4B. Electronic device 4000 also comprises a second metal plate 4152. Second metal plate 4152 may extend along fourth wall 4114, second wall 4112, and third wall 4113. In some examples, second metal plate extends along the entire length of fourth wall 4114, but extends for a portion (e.g., not the entirety) of the length of second wall 4112 and third wall 4113. Electronic device 4000 comprises retention rack 4180. Unlike retention rack 180, retention rack 4180 extends along first wall 4111, second wall 4112, third wall 4113, and fourth wall 4114. Retention rack 4180 secures first metal plate 4151 and second metal plate 4152 to first wall 4111, second wall 4112, third wall 4113, and fourth wall 4114 in a similar manner that retention rack 180 secures metal plate 151 to first wall 111, second wall 112, and third wall 113.

In some examples, electronic device 4000 comprises a first belt track 4170, a second belt track 4171, a gear 4172, a right tab 4160R, and a left tab 4160L (not visible in FIG. 11). First belt track 4170 is secured to first metal plate 4151 such that a movement of first metal plate 4151 also moves first belt track 4170. Second belt track 4171 is secured to second metal plate 4152 such that a movement of second metal plate 4152 also moves second belt track 4171. In some examples, and as shown in FIG. 11, first belt track 4170 and second belt track 4171 both have teeth on a surface. These teeth interact with gear 4172 and connect first belt track 4170 to second belt track 4171. Accordingly, movement of first metal plate 4151 in a first direction causes first belt track 4170 to move in the same first direction. Due to the teeth on first belt track 4170, the teeth on second belt track 4171, and gear 4172, movement of first belt track 4170 in the first direction causes second belt track 4171 to move in the opposite direction. Movement of second belt track 4171 in the opposite direction causes movement of second metal plate 4152 in the same opposite direction.

Right tab 4160R is a flange that protrudes from outside of housing 4110. Right tab 4160R slides in a slot in housing 4110 allowing for limited movement 900 of right tab 4160R. Right tab 4160R is secured to first metal plate 4151 such that movement of right tab 4160R in one direction moves first metal plate 4151 in the same direction. Left tab 4160L is a flange that protrudes from outside of housing 4110. Similar to right tab 4160R, left tab 4160L slides in a slot in housing 4110 allowing for limited back and forth movement 900 of left tab 4160L. Left tab 4160L is also secured to first metal plate 4151 such that movement of left tab 4160L in one direction moves first metal plate 4151 in the same direction. In some examples, left tab 4160L is secured to first metal plate 4151 at an opposite end of where right tab 4160R is secured to first metal plate 4151. For example, if right tab 4160R is secured to the portion of first metal plate 4151 that extends on third wall 4113 then left tab 4160L is secured to the portion of first metal plate 4151 that extends on second wall 4112.

Figure 12A:
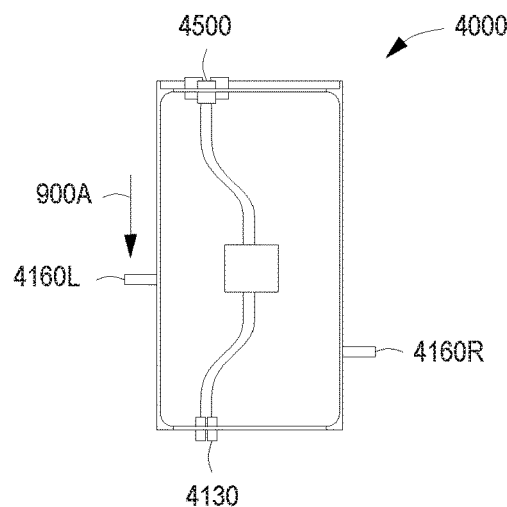
FIG. 12A illustrates the movement of the optical connector of the electronic device of FIG. 11, according to some examples.
Figure 12B:
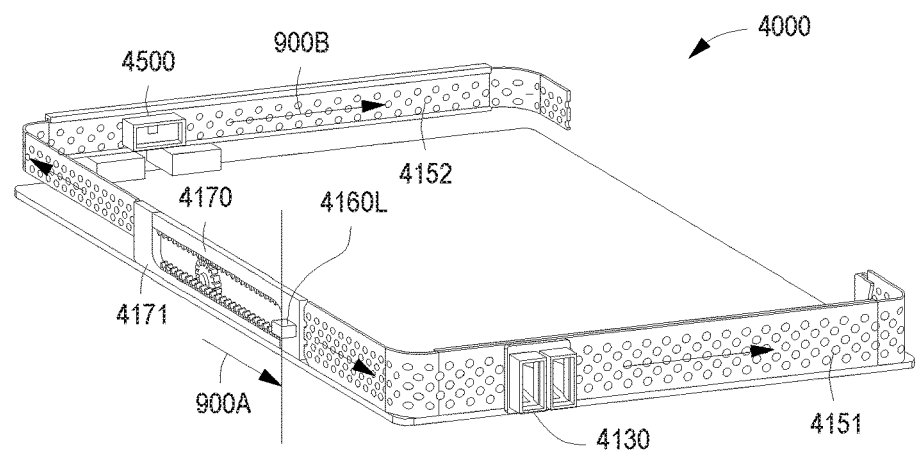
FIG. 12B illustrates the movement of the optical connector of the electronic device of FIG. 11, according to some examples.
Figure 12C:
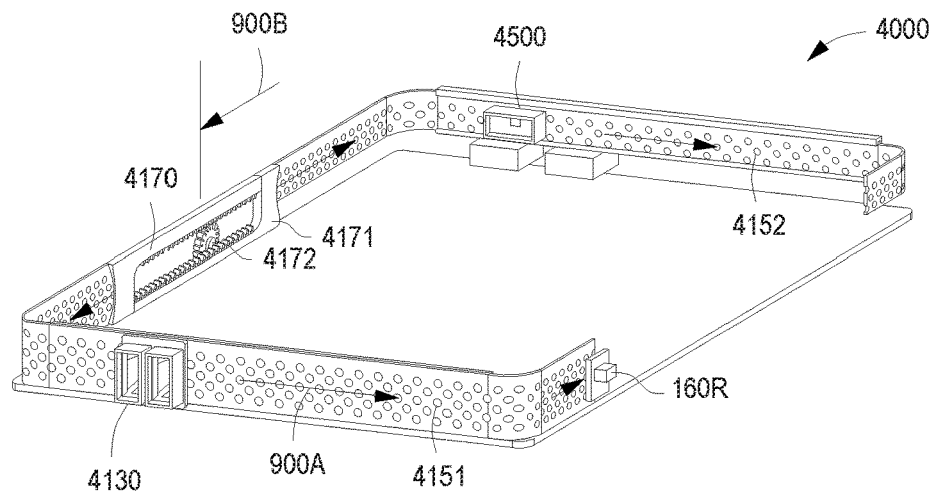
FIG. 12C illustrates the movement of the optical connector of the electronic device of FIG. 11, according to some examples.

FIGS. 12A-12C show the operation of electronic device 4000 with the movement of left tab in direction 900A. FIG. 12A is a top view of electronic device 4000. FIG. 12B is a left, front perspective view. FIG. 12C is a right, front perspective view. Direction 900A may also be characterized as a counter-clockwise direction. In FIG. 12A, first optical connector 4130 and second optical connector 4500 are initially on an operable position that is located on the left side of the front faceplate and the left side of the backplate. In some examples, the initial orientations of the optical connectors may be incompatible with a rack in which the mating optical connectors for first optical connector and second optical connector are located on the right side of electronic device 4000.

However, movement of left tab 4160L in direction 900A may automatically move the first optical connector 4130 and the second optical connector 4500 to the right side of electronic device 4000. This is shown in FIGS. 12B and 12C. Movement of left tab 4160L in direction 900A moves first metal plate 4151 in the same direction 900A. Because first optical connector 4130 is secured to first metal plate 4151, first optical connector 4130 moves in direction 900A from a first operable position (located on the left side of electronic device 4000) to a second operable position that is located on the right side of electronic device 4000.

As described above, first metal plate 4151 is secured to first belt rack 4170. Thus, movement of left tab 4160L in direction 900A also moves first belt rack 4170 in direction 900A. Due to the interaction of teeth on first belt rack 4170 with gear 4172 and the interaction with gear 4172 with teeth on second belt track 4171, movement of first belt rack 4170 in direction 900A moves second belt rack 4171 in direction 900B. Direction 900B may also be characterized as a clockwise direction. Because second belt rack 4171 is secured to second metal plate 4152, second metal plate 4152 also moves in direction 900B. This movement causes second optical connector 4500 to move from a third operable position (located on the left side of electronic device 4000) to a fourth operable position (located on the right side of electronic device 4000) along fourth wall 4114. As discussed above, the amount of movement 900A of left tab 4160L may be dependent on the length of the slot for left tab 4160L in housing 4110. In some examples, the slot is long enough such that it allows sufficient movement of left tab 4160L to cause first optical connector 4130 and second optical connector 4500 to move from a left side to a right side of electronic device 4000. Housing 4110 is not shown in FIGS. 12B and 12C for clarity.

Figure 13A:
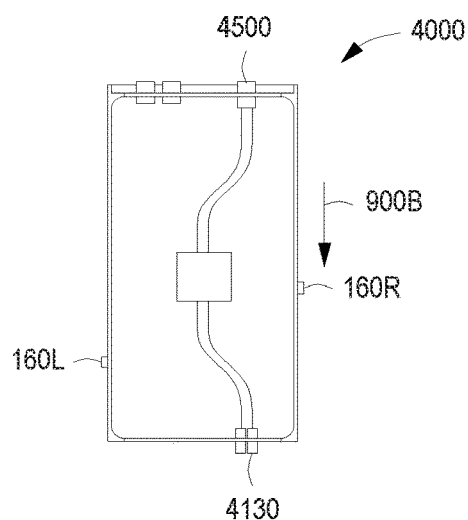
FIG. 13A illustrates the movement of the optical connector of the electronic device of FIG. 11, according to some examples.
Figure 13B:
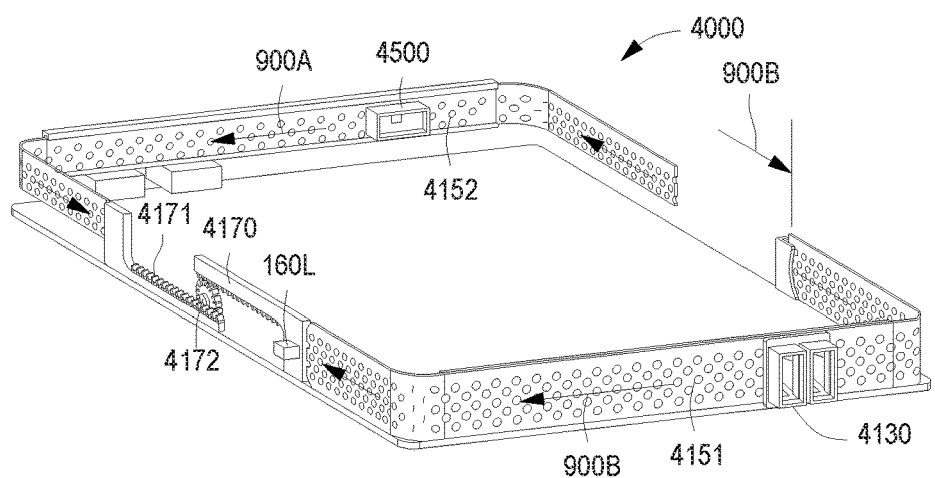
FIG. 13B illustrates the movement of the optical connector of the electronic device of FIG. 11, according to some examples.
Figure 13C:
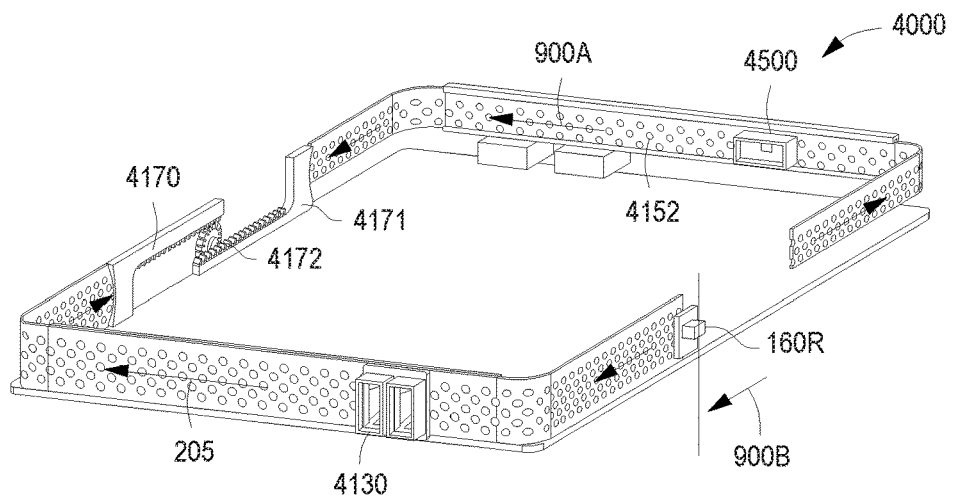
FIG. 13C illustrates the movement of the optical connector of the electronic device of FIG. 11, according to some examples.

FIGS. 13A-13C show the operation of electronic device 4000 with the movement of right tab in direction 900B. FIG. 13A is a top view of electronic device 4000. FIG. 13B is a left, front perspective view. FIG. 13C is a right, front perspective view. Direction 900B may also be characterized as a clockwise direction. In FIG. 13A, first optical connector 4130 and second optical connector 4500 are initially on an operable position that is located on the right side of the front faceplate and the right side of the backplate. In some examples, this orientation of the optical connectors may be incompatible with a rack in which the mating optical connectors for first optical connector and second optical connector are located on the left side of electronic device 4000. However, movement of right tab 4160R in direction 900B may automatically move the first optical connector 4130 and the second optical connector 4500 to the left side of electronic device 4000. This is shown in FIGS. 13B and 13C. Movement of right tab 4160R in direction 900B moves first metal plate 4151 in the same direction 900B. Because first optical connector 4130 is secured to first metal plate 4151, first optical connector 4130 moves in direction 900B from a first operable position (located on the right side of electronic device 4000) to a second operable position (located on the left side of electronic device 4000).

As described above, first metal plate 4151 is secured to first belt rack 4170. Thus, movement of right tab 4160R in direction 900B also moves first belt rack 4170 in direction 900B. Due to the interaction of teeth on first belt rack 4170 with gear 4172 and the interaction with gear with teeth on second belt track 4171, movement of first belt rack 4170 in direction 900B moves second belt rack 4171 in direction 900A. Because second belt rack 4171 is secured to second metal plate 4152, second metal plate 4152 also moves in direction 900A. This movement causes second optical connector 4500 to move from a third operable position (located on the right side of electronic device 4000) to a fourth operable position (located on the right side of electronic device 4000) along fourth wall 4114. As discussed above, the amount of movement 900B of right tab 4160R may be dependent on the length of the slot for right tab 4160R in housing 4110. In some examples, the slot is long enough such that it allows sufficient movement of right tab 4160R to cause first optical connector 4130 and second optical connector 4500 to move from a right side to a left side of electronic device 4000. Housing 4110 is not shown in FIGS. 13B and 13C for clarity.

FIGS. 14A-14C illustrate top views of electronic device 4000 interacting with an enclosure 5000. In some examples, enclosure 5000 is a rack shelf that is designed for half-width servers. Enclosure 5000 has a divider 5001 to divide rack shelf 5000 into two bays, 5000A and 5000B. Bay 5000A has a mating optical connector 5500A on the left side of enclosure 5000. Bay 5000B has a mating optical connector 5500B on the right side. Enclosure 5000 also has an actuator 5002 that protrudes from divider 5001 into the inside space of bays 5000A and 5000B. In some examples, actuator 5002 is secured to divider 5001 such that actuator 5002 does not move in relation to divider 5001. Additionally, in some examples, actuator 5002 is shaped and sized to engage with right tabs 4160R and left tabs 4160L of electronic devices 4000A and 4000B inserted into bays 5000A and 5000B, respectively.

FIG. 14A illustrates the insertion of electronic device 4000A into bay 5000A. Electronic device 4000A has a first optical connector 4130 and a second optical connector 4500 that are initially positioned on the right side of electronic device 4000A. This is incompatible with the location of mating optical connector 5500A. However, due to right tab 4160R and actuator 5002, first optical connector 4130 and second optical connector 4500 may be automatically moved from the operable positions shown in FIG. 14A to the operable positions located on the left side of electronic device 4000A.

When electronic device 4000A is inserted into bay 5000A, actuator 5002 engages with right tab 4160R to move it in direction 900B. Accordingly, right tab 4160R is automatically moved upon insertion of electronic device 4000A into bay 5000A. This automatic movement of right tab 4160R is opposed to a manual movement of right tab 4160R that occurs when right tab 4160R is directly moved by a user of electronic device 4000A. Movement of right tab 4160R automatically moves first optical connector 4130 from a first operable position to a second operable position. Movement of right tab 4160R also automatically moves second optical connector 4500 from a third operable position to a fourth operable position. These new operable positions are shown in FIG. 14B in solid lines. The previous operable positions of first optical connector 4130 and second optical connector 4500 are shown in dotted lines in FIG. 14B. The movement is shown by the dotted arrows. With the automatic biasing of second optical connector 4500, second optical connector 4500 may now be connected to mating optical connector 5500A.

FIG. 14B also illustrates the insertion of electronic device 4000B into bay 5000B. Electronic device 4000B has a first optical connector 4130 and a second optical connector 4500 that are initially positioned on the left of electronic device 4000B. This is incompatible with the location of mating optical connector 5500B. However, due to left tab 4160L and actuator 5002, first optical connector 4130 and second optical connector 4500 may be moved from the operable positions shown in FIG. 14B to operable positions located on the left side of electronic device 4000B. When electronic device 4000B is inserted into bay 5000B, actuator 5002 engages with left tab 4160L to move it in direction 900A. Accordingly, left tab 4160L is automatically moved upon insertion of electronic device 4000B into bay 5000B. Movement of left tab 4160L automatically moves first optical connector 4130 from a first operable position to a second operable position. Movement of left tab 4160L also automatically moves second optical connector 4500 from a third operable position to a fourth operable position. These new operable positions are shown in FIG. 14C in solid lines. The previous operable positions of first optical connector 4130 and second optical connector 4500 are shown in dotted lines in FIG. 14C. The movement is shown by the dotted arrows. With the automatic biasing of second optical connector 4500, second optical connector 4500 of electronic device 4000B may now be connected to mating optical connector 5500B. Although enclosure 5000 is described as a rack shelf in relation to FIGS. 14A-14C, enclosure 5000 may be a casing used for any system, such as casing for a storage module, a processing unit, etc.

All of the features disclosed in this specification (including any accompanying claims, abstract and drawings), and/or all of the elements of any method or process so disclosed, may be combined in any combination, except combinations where at least some of such features and/or elements are mutually exclusive.

What is claimed is:

1. An electronic device comprising:
a housing with a first wall, a second wall, and a third wall;
an optical fiber within the housing;
a first optical connector secured to the optical fiber and moveable between a first position and a second position along the first wall, wherein the first position and the second position are at different longitudinal locations on the first wall;
a track that extends from the first position to the second position in a direction that is parallel to the first wall; and
a first metal plate extending along the first wall, the second wall, and the third wall, wherein the first metal plate is moveable between the first position and the second position.

2. The electronic device of claim 1, wherein the first optical connector protrudes from the first wall in the first position and the second position.

3. The electronic device of claim 2, wherein the first optical connector protrudes from the first wall while moving between the first position and the second position.

4. The electronic device of claim 1, comprising a fastener to hold the first optical connector in the first position.

5. The electronic device of claim 1, wherein the first optical connector is secured on the first metal plate.

6. The electronic device of claim 5, comprising a left tab extending from the housing and secured to the first metal plate, wherein movement of the left tab in a first direction moves the first optical connector from the first position to the second position.

7. The electronic device of claim 6, wherein the movement of the left tab in the first direction is automatic upon insertion of the electronic device into an enclosure.

8. The electronic device of claim 5,
wherein the housing comprises a fourth wall;
wherein the electronic device comprises:
a second metal plate extending along the fourth wall, the third wall, and the second wall; and
a second optical connector secured to the second metal plate; and
wherein the second optical connector is moveable between a third position and a fourth position along the fourth wall.

9. The electronic device of claim 8, comprising:
a first belt track secured to the first metal plate;
a second belt track secured to the second metal plate; and
a gear linking the first belt and the second belt, wherein a movement of the first optical connector moves the second optical connector.

10. A server comprising:
a housing with a first wall;
an optical fiber within the housing;
an optical connector secured to the optical fiber and having a number of operable positions at different longitudinal locations along the first wall; and
a retention track that extends alongside the number of operable positions in a direction that is parallel to the first wall, wherein the optical connector protrudes through the first wall.

11. The server of claim 10, wherein the optical connector comprises:
a carrier member; and
a base member engaged with the retention track, wherein the carrier member is moveable in relation to the base member to retract the optical connector inside the housing.

12. The server of claim 10, comprising a fastener to hold the optical connector in the number of operable positions, wherein the fastener is moveable in the retention track.

13. The electronic device of claim 10, wherein the housing comprises a number of openings equal to the number of operable positions.

14. The electronic device of claim 10, comprising a spring to bias the optical connector to protrude through the first wall.

15. An electronic device comprising:
a housing with a first wall and an opening;
an optical fiber within the housing;
a first optical connector secured to the optical fiber and moveable between a first position and a second position along the first wall, wherein the first position and the second position are at different longitudinal locations on the first wall; and
a track that extends from the first position to the second position in a direction that is parallel to the first wall, wherein the first optical connector resides outside of the housing and the optical fiber extends from inside the housing through the opening to secure the first optical connector.

* * * * *